United States Patent [19]

Watanabe et al.

[11] 4,323,659
[45] Apr. 6, 1982

[54] NON-FLAMMABLE ADHESIVE COMPOSITIONS

[75] Inventors: Masanao Watanabe; Keiichi Naito; Tooru Odajima; Yoshio Fujiwara, all of Kanuma, Japan

[73] Assignee: Sony Corporation, Tokyo, Japan

[21] Appl. No.: 212,801

[22] Filed: Dec. 4, 1980

[51] Int. Cl.$^3$ ............................................. C08L 63/00
[52] U.S. Cl. .................................... 525/108; 525/109
[58] Field of Search ............................... 525/108, 109

[56] References Cited

U.S. PATENT DOCUMENTS 4,021,403  5/1977  Fujiwara et al. ................... 525/108

FOREIGN PATENT DOCUMENTS 53-125236  3/1978  Japan ................................... 525/109

Primary Examiner—Paul Lieberman
Assistant Examiner—Robert Sellers
Attorney, Agent, or Firm—Hill, Van Santen, Steadman, Chiara & Simpson

[57] ABSTRACT

The non-flammable adhesive compositions contain 100 parts by weight of a brominated epoxy resin such as a bisphenol type brominated epoxy resin or a novolak type brominated epoxy resin; 40–80 parts by weight of an acrylic copolymer and 5–20 parts by weight of a brominated polyvinyl phenol, said acrylic copolymer being prepared by copolymerizing (a) 5–35% by weight of acrylonitrile, (b) 0.5–10% by weight of an ethylenically unsaturated compound having at least one functional group selected from carboxyl, hydroxyl and epoxy group, and (c) substantially the balance of an ester obtainable from an alcohol having from 1 to 6 carbon atoms and acrylic acid and/or methacrylic acid.

11 Claims, No Drawings

NON-FLAMMABLE ADHESIVE COMPOSITIONS

BACKGROUND OF THE INVENTION

1. Field of the Invention

The present invention relates to a non-flamable adhesive composition and, more particularly, to a non-flamable adhesive composition appropriate for use on the manufacture of, in particular, flexible printed circuit boards.

2. Brief Description of Prior Art

Polyimide series films, unlike other plastic films, have a combination of, particularly, outstandingly superior heat resistance and dimensional stability with non-flamability. Accordingly, if such polyimide series films would be applied to flexible printed circuit boards by allowing a metal foil for conductive pattern to adhere to the films, they will provide accurate printed circuits which require high dimensional accuracy or precision in processing and which are appropriate for use on circuit boards for machinery and tools that require heat resistance under operational conditions.

Heretofore, although a number of adhesives having superior electrical performance and high adhesion for printed circuits have been proposed, little attempts have been so far made to have adhesives non-flamable making the best use of the non-flamable characteristics of the polyimide series films satisfying the requirements according to Underwriters Laboratory (UL) Standards 94V-O with respect to non-flamability. Many states of the United States of America require electrical appliances, by laws, to satisfy the UL Standards and procure the grant of the UL Standards Recognition. Thus, plastics to be used for electrical and electronical parts and apparatuses are required to be rendered non-flamable.

SUMMARY OF THE INVENTION

Therefore, the object of the present invention is to provide a non-flamable adhesive composition which is appropriate for use of particularly flexible printed circuit boards.

Another object of the present invention is to provide a non-flamable adhesive composition which can satisfy the UL Standards with respect to non-flamability.

A further object of the present invention is to provide a non-flamable adhesive composition having a combination of heat resistance and dimensional stability with non-flamability.

Other objects, features and advantages will become apparent as the description proceeds.

According to one aspect of the present invention, there is provided a non-flamable adhesive composition comprising a brominated epoxy resin, an acrylic copolymer, and a brominated polyvinylphenol as major formulation components, said acrylic copolymer being prepared by copolymerizing acrylonitrile with an ethylenically unsaturated compound having at least one functional group selected from the group consisting of carboxyl, hydroxyl and epoxy groups and an ester obtainable from an alcohol having from 1 to 6 carbon atoms and acrylic acid and/or methacrylic acid.

According to another aspect of the present invention, there is provided a non-flamable adhesive composition comprising the above components and, in addition thereto, a cure accerelator such as, particularly, an amine compound and/or an imidazole compound.

DETAILED DESCRIPTION OF THE INVENTION

The non-flamable adhesive compositions according to the present invention, as stated hereinabove, comprises a brominated epoxy resin, an acrylic copolymer, and a brominated polyvinylphenol as major components.

The brominated epoxy resins to be used for the non-flamable adhesive compositions according to the present invention may include a bisphenol type brominated epoxy resin represented by the following formula:

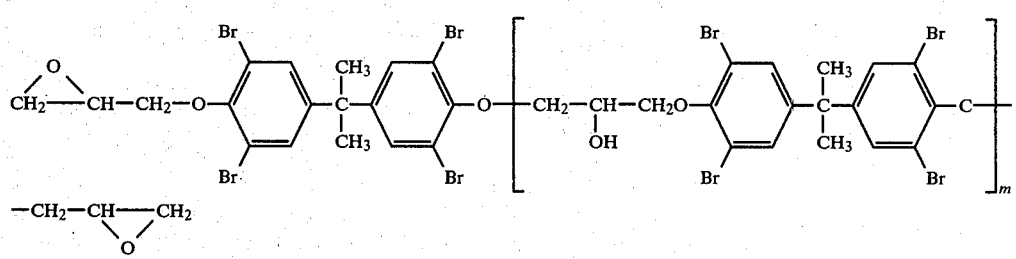

(wherein m is 0, 1 or 2) and a novolak type brominated epoxy resin represented by the following formula:

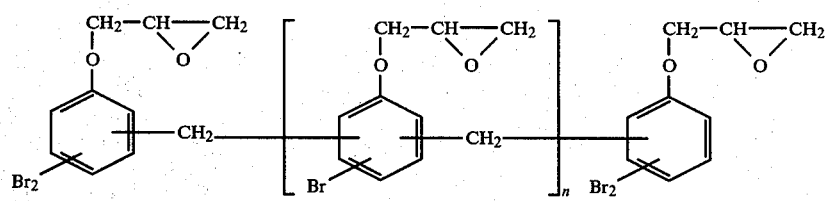

(wherein n is an integer of less than 10, preferably $0 \leq n \leq 4$). In this case, the use of the bisphenol type epoxy resin of the above formula wherein m is 3 or more is not desired because it causes a decrease in cross-linking density.

The acrylic copolymers to be used as one of major components in the non-flamable adhesive compositions according to the present invention may be prepared by copolymerizing acrylonitrile with an ethylenically unsaturated compound and an ester of an alcohol with acrylic acid and/or methacrylic acid.

In the copolymerization, acrylonitrile may be used in an amount of from about 5 to 35% by weight. Where the amount of acrylonitrile is less than the lower amount, heat resistance against soldering will be impaired, and where the amount thereof is beyond the upper amount, a solubility in a reaction solution, that is, a mixture of the solvent and the other ethylenically unsaturated compound, will be reduced.

The ethylenically unsaturated compounds to be used for copolymerization may be ones having at least one functional group selected from the group consisting of a carboxyl, hydroxyl and epoxy group. They may include, for example, (1) an acrylic acid and/or methacrylic acid, (2) a glycidyl acrylate or glycidyl methacrylate having at least an epoxy group, (3) an acrylic acid and/or methacrylic acid each having at least a hydroxyl group such as β-hydroxylethyl acrylate, β-hydroxyethyl methacrylate, β-hydroxypropyl acrylate and β-hydroxypropyl methacrylate. The ethylenically unsaturated compounds may be used singly or in combination with each other and in an amount of from about 0.5 to 10% by weight. When the ethylenically unsaturated compounds are used in an amount below the lower amount, heat resistance will be decreased. When the ethylenically unsaturated compounds are used beyond the upper amount, electrical performance will be impaired.

The esters to be used as one of the components for the acrylic copolymers of the non-flamable adhesive compositions according to the present invention may be ones obtainable from the esterification of an alcohol having from 1 to 6 carbon atoms with acrylic acid and/or methacrylic acid. The alcohols to be used for this purpose may be any mono-hydric alcohol in which the lower alkyl moiety thereof may be a straight or branched chain saturated hydrocarbon residue having from 1 to 6 carbon atoms, e.g., methyl, ethyl, propyl, butyl or the like. The esters of the type stated hereinabove may be used in an amount as the balance for the copolymer components and may be in an amount generally from about 55 to 94.5% by weight. This amount may vary, of course, according to amounts of other components which may be used for the manufacture of the acrylic copolymers appropriate for the use according to the present invention.

With the above components in appropriate amounts, the acrylic copolymers may be prepared in conventional manner. The resulting acrylic copolymers to be used in the present invention may have weight average molecular weights ranging generally from about 100,000 to about 500,000 when measured according to gel permeation chromatography (GPC).

The acrylic copolymers may be used in an amount of from about 40 to 80 parts by weight based on 100 parts by weight of the brominated epoxy resin. When the acrylic copolymers are used below the lower amount, an adhesion will be remarkably decreased. When they are used beyond the upper amount, non-flamability and electrical performances will be reduced because of the small relative amount of the brominated epoxy resin.

The brominated polyvinyl phenols to be used as one of the components for the non-flamable adhesive compositions according to the present invention may be any compound having a moiety represented by the following recurring unit:

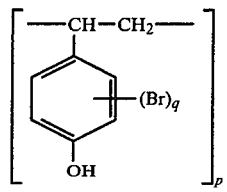

(wherein p is an integer from 20 to 70 and q is 1 or 2).

The brominated polyvinylphenol may be used singly or in combination with other brominated polyvinylphenol or pehnols in which either or both of p and q is or are different from the former and/or the position or positions of bromine substituent or substituents is or are different from the former. They may be added in an amount of from about 5 to 20 parts by weight based on 100 parts by weight of the brominated epoxy resin. When the amount of the brominated polyvinyl pehnol is less than the lower amount, heat resistance will be reduced. And when the brominated polyvinyl phenol is used beyond the upper amount, an adhesion as an adhesive will be decreased.

A curing accelerator may be added, when desired, to the non-flamable adhesive compositions according to the present invention. The curing accelerators may include, for example, an amine compound and an imidazole compound. They may be used in an amount ranging from about 0.6 to 2 parts by weight based on 100 parts by weight of the brominated epoxy resin. When the amount of the curing accelerators is below the lower amount, the curing action will be so small that the reactivity of the brominated epoxy resin will be reduced and consequently provide a poor heat resistance. When the amount thereof is beyond the upper amount, heat resistance will be decreased. The amine compounds may include, for example, primary, secondary and tertiary aliphatic amines with an alkyl group, e.g., methyl, ethyl, propyl, isopropyl, butyl, amyl, hexyl, heptyl, octyl or the like (for example, methylamine, ethylamine, diethylamine, tripropylamine and so on) and mixtures thereof, unsaturated aliphatic amines such as allylamine and so on, alicyclic amines such as cyclopropylamine and so on, and aromatic amines such as aniline and so on. Illustrative of the imidazoles are, for example, imidazoles of the type substituted by an unsubstituted and/or substituted lower alkyl group or groups and of the type substituted by an aromatic group. The imidazoles of the type substituted by an alkyl group or groups may include, for example, di-substituted imidazoles such as alkylimidazoles, e.g., 2-ethylimidazole, 2-undecylimidazole and so on, 2,4-dialkyl imidazoles, e.g., 2,4-dimethylimidazole, diethylimidazole and so on, 1-(cyanosubstituted alkyl)-2-alkyl imidazoles, e.g., 1-(2-cyanoethyl)-2-methylimidazole and so on, and tri-substituted imidazoles such as 1-(cyanosubstituted alkyl)-2,4-dialkyl imidazoles, e.g., 1-(2-cyanoethyl)-2-propyl-4-methylimidazole and so on. The aromatic substituted imidazoles may include, for example, benzylimidazoles and so on.

The non-flamable adhesive composition of the present invention may include other components to improve electrical characteristics and/or heat resistance characteristics. Examples of such components are an epoxy resin of both the bisphenol type and the novolak type without containing bromine, a phenolic resin, and a malamine resin. However, an amount of the components to be added should be up to 10 parts by weight based on 100 parts by weight of the brominated epoxy resin in order not to avoid the non-flamability of the adhesive composition.

To the non-flamable adhesive compositions having the components as stated hereinabove may be added another non-flamable inorganic material such as, for example, antimony trioxide, aluminum hydroxide, barium borate and so on. The inorganic materials may be added in an amount ranging below about 20 parts by weight based on 100 parts by weight of the brominated epoxy resin.

The non-flamable adhesive compositions according to the present invention may be obtained from the components as stated hereinabove in conventional manner, for example, by merely mixing all the components by conventional mixing methods.

The non-flamable adhesive compositions according to the present invention may be then coated on a conventional base material on which a metal foil may be laminated to form a flexible printed circuit board. The flexible printed circuit boards as prepared in the above manner can provide a secure adhesion, high heat resistance, resistance to aging at high temperatures, favorable electrical performance and non-flamability.

When the non-flamable adhesive compositions are applied to the manufacture of flexible printed circuit boards, they are coated on a polyimide or polyparabanic acid film or a copper foil and then dried. The coated film or foil is then laminated with a copper foil or a polyimide or polyparabanic acid film, respectively. In this case, the lamination of a film with a copper foil can be conducted by continuous roll lamination procedures so that productivity of circuit boards is extremely favorable. The unnecessary portions of the copper foil is then etched out to form a desired circuit pattern of the copper foil on the board.

The following examples will illustrate the present invention more in detail.

EXAMPLE 1

A gas in flask equipped with a reflux condenser, a dropping funnel and a stirrer was substituted by nitrogen gas and a mixed solution having the following composition was refluxed in the flask at 70° C. for 10 hours with stirring:

| Components | Parts by weight |
|---|---|
| Acrylonitrile | 20 |
| Ethyl acrylate | 68 |
| Methyl methacrylate | 10 |
| Acrylic acid | 2 |
| Azobisisobutyronitrile | 1 |
| Ethyl acetate | 100 |

The resulting acrylic copolymer prepared by the above solution polymerization (hereinafter referred to as "Gum 1") was diluted to a 30% concentration to give a viscous solution having a viscosity 2,650 cps (at 25° C.). The weight average molecular weight of the Gum 1 was 265,600 according to the GPC measurement.

The viscous solution was used to give an adhesive composition having the following components:

| Components | Parts by weight |
|---|---|
| Gum 1 | 60 |
| Bisphenol type brominated epoxy resin (a non-flamable epoxy resin derived from tetrabromobisphenol; Epiclon E-152, product of Dainippon Ink and Chemical Inc.) | 100 |
| Brominated polyvinylphenol (Resin MB, product of Maruzen Petroleum Co., Ltd.; the bromine number in the above general formula being average 1.5) | 10 |
| 2-Ethylimidazole (2Ez, product of Shikoku Chemicals Corp) | 0.6 |

The above adhesive composition was diluted with a mixed solvent of methyl ethyl ketone:ethyl alcohol=1:1 to provide an adhesive composition solution having a 35% concentration.

This solution was then coated on a ca. 25 micron thick polyimide film (Kapton, product of E. I. du Pont de Nemours & Company) to give a coating having a dry thickness of ca. 25 microns. The coated film was dried at 80° C. for 3 minutes and then at 140° C. for 5 minutes and rolled together with a copper foil having a thickness of 35 microns through a press roll under a pressure of 20 kg/cm at 140° C. to laminate the copper foil on the adhesive coated surface of the film. In order to ensure a lamination, the laminated film was then heated at 100° C. for 2 hours and thereafter at 120° C. for 12 hours in an oven to provide a full cure.

EXAMPLE 2

The procedures of Example 1 were followed with the exception that a mixture having the following composition was used in spite of the composition of Example 1 to give an acrylic copolymer (hereinafter called "Gum 2"):

| Components | Parts by weight |
|---|---|
| Acrylonitrile | 30 |
| Ethyl acrylate | 66.5 |
| Methyl acrylate | 0.5 |
| Glycidyl methacrylate | 3.0 |
| Azobisisobutyronitrile | 1.0 |
| Ethyl acetate | 100 |

This Gum 2 was diluted to a 30% concentration to give a viscous solution having a viscosity of 3,250 cps (at 25° C.). The weight average molecular weight of the Gum 2 was found to be 305,200 according to the GPC measurement.

The Gum 2 was used to give an adhesive composition having the following components:

| Components | Parts by weight |
|---|---|
| Gum 2 | 70 |
| Bisphenol type brominated epoxy resin (the same as in Example 1) | 100 |
| 2-Undecyl imidazole | 0.8 |
| Brominated polyvinylalcohol (the same as in Example 1) | 17 |

The solution was coated on a film, laminated with a copper foil after drying and cured to a full extent.

EXAMPLE 3

The procedures of Example 1 were followed with the exception that a mixture having the following composition was used in place of the composition of Example 1 to give an acrylic copolymer (hereinafter called "Gum 3"):

| Components | Parts by weight |
| --- | --- |
| Acrylonitrile | 20 |
| Butyl acrylate | 30 |
| Ethyl acrylate | 45 |
| Glycidyl methacrylate | 5 |
| Azobisisobutyronitrile | 0.8 |
| Ethyl acetate | 100 |

This Gum 3 was diluted to a 30% concentration to give a viscous solution having a viscosity of 2,850 cps (at 25° C.). The Gum 3 had a weight average molecular weight of 321,500 according to the GPC measurement.

The Gum 3 was then treated in the same manner as in Example 1 to give an adhesive composition solution having the following components by using a mixture of methyl ethyl ketone:ethyl alcohol=1:1, a 35% concentration):

| Components | Parts by weight |
| --- | --- |
| Gum 3 | 45 |
| Novolak type brominated epoxy resin (Kayacryl Resin RE101B, product of Nippon Kayaku Co., Ltd.) | 100 |
| Brominated polyvinyl alcohol (the same as in Example 1) | 7 |
| 2,4-Dimethylimidazole | 1.0 |
| Bisphenol type epoxy resin (Epicote 1001, product of Shell Chemicals Co.) | 10 |

This adhesive composition solution was coated on a film which was in turn laminated with a copper foil after drying and then fully cured in substantially the same manner as in Example 1.

EXAMPLE 4

The procedures of Example 1 were followed with the exception that a mixture having the following composition was used in place of the composition of Example 1 to give an acrylic copolymer (hereinafter called "Gum 4"):

| Components | Parts by weight |
| --- | --- |
| Acrylonitrile | 15 |
| Butyl acrylate | 30 |
| Ethyl acrylate | 53 |
| Acrylic acid | 1.0 |
| β-hydroxyethylmethacrylate | 1.0 |
| Azobisisobutyronitrile | 0.8 |
| Ethyl acetate | 100 |

The Gum 4 was diluted to a 30% concentration to give a viscous solution having a viscosity of 3,030 cps (at 25° C.). The weight average molecular weight of this Gum 4 was found to be 284,000 when measured according to the GPC procedure. The Gum 4 was treated in substantially the same manner as in Example 1 to give an adhesive composition solution and then coated on a film followed by full curing. The adhesive composition has the following components:

| Components | Parts by weight |
| --- | --- |
| Gum 4 | 70 |
| Novalak type brominated epoxy resin (the same as in Example 3) | 100 |
| Brominated Polyvinylphenol (the same as in Example 1) | 20 |
| 2-Undecylimidazole | 2.0 |

EXAMPLE 5

An acrylic copolymer (hereinafter called "Gum 5") was synthesized by the suspension polymerization as follows:

A three-neck distillation flask was fed with 300 parts by weight of deionized water as a solvent, 4.5 parts by weight of polyvinylalcohol (Gohsenol GH-17; product of The Nippon Synthetic Chemical Industry Co., Ltd.; saponification degree, 86.5–89%; viscosity, 30–33 cps) as a suspending agent, and 1.5 parts by weight of sodium chloride as an auxiliary stabilizer. The mixture was stirred under nitrogen stream to substitute the gas in the flask by nitrogen. Into the flask was added a mixture of the following components:

| Components | Parts by weight |
| --- | --- |
| Acrylonitrile | 15 |
| Ethyl acrylate | 20 |
| Butyl Acrylate | 60 |
| Methyl methacrylate | 3 |
| Methacrylic acid | 2 |
| Azobisisobutyronitrile | 1.5 |

The mixture was stirred at 70° C. for 4 hours to effect polymerization. The resulting products were separated by filtration and washed with hot water to remove polyvinylalcohol and sodium chloride followed by the drying, thereby providing Gum 5 having a weight average molecular weight of about 290,000.

The Gum 5 was treated in substantially the same manner as in Example 1 to give an adhesive composition solution (35% concentration) having the following components:

| Components | Parts by weight |
| --- | --- |
| Gum 5 | 80 |
| Bisphenol type brominated epoxy resin (the same as in Example 1) | 100 |
| Brominated polyvinylphenol (the same as in Example 1) | 20 |
| 2-Undecylimidazole | 0.6 |

The resulting solution was coated on a film and dried followed by laminating a copper foil thereon and subsequently curing to a full extent.

EXAMPLE 6

An acrylic copolymer (hereinafter called "Gum 6") was prepared by means of suspension polymerization as follows:

In substantially the same manner as in Example 5, a mixture having the following components was used:

| Components | Parts by weight |
|---|---|
| Acrylonitrile | 15 |
| Ethyl acrylate | 33 |
| Butyl acrylate | 50 |
| β-hydroxyethyl methacrylate | 2 |
| Azobisisobutyronitrile | 1.5 |

After the resulting products were separated by filtration, they were washed with boiling water to remove polyvinyl alcohol and sodium chloride and dried to give Gum 6 having a weight average molecular weight of about 340,000. The procedures of Example 1 were followed to provide an adhesive composition solution (35% concentration) which was in turn coated on a film, dried and laminated with a copper foil followed by curing to a full extent. The solution had the following components:

| Components | Parts by weight |
|---|---|
| Gum 5 | 20 |
| Gum 6 | 20 |
| Bisphenol type brominated epoxy resin (the same as in Example 1) | 100 |
| Brominated polyvinylphenol (the same as in Example 1) | 10 |
| 2-Ethylimidazole | 1.5 |

COMPARATIVE EXAMPLE 1

In substantially the same manner as in Example 1, an acrylic copolymer (Gum 7) was obtained from the solution having the following components:

| Components | Parts by weight |
|---|---|
| Acrylonitrile | 15 |
| Ethyl acrylate | 30 |
| Butyl acrylate | 54.7 |
| Acrylic acid | 0.3 |

Gum 7 is small in the amount of acrylic acid than the range of the present invention so that degree of cross-linking is small.

The Gum 7 was treated in the same manner as in Example 1 to give an adhesive composition solution which was in turn coated on a film, laminated with a copper foil after drying and cured to a full extent. The solution had the following components:

| Components | Parts by weight |
|---|---|
| Gum 7 | 60 |
| Bisphenol type brominated epoxy resin (the same as in Example 1) | 100 |
| Brominated polyvinylphenol (the same as in Example 1) | 10 |
| Benzylimidazole | 0.7 |

COMPARATIVE EXAMPLE 2

In substantially the same manner as in Example 1, an adhesive composition solution having the following components was prepared, coated on a film, laminated with a copper foil after drying, and cured:

| Components | Parts by weight |
|---|---|
| Gum 5 | 100 |
| Novolak type brominated epoxy resin (the same as in Example 3) | 100 |
| Brominated polyvinylphenol (the same as in Example 1) | 15 |
| 2-Undecylimidazole | 1 |

This example contains a gum material in an amount larger than the scope according to the present invention.

COMPARATIVE EXAMPLE 3

In substantially the same manner as in Example 1, an adhesive composition in the form of a solution was prepared, coated on a film, laminated with a copper foil after drying, and cured. The composition was composed of the following components:

| Components | Parts by weight |
|---|---|
| Gum 5 | 30 |
| Bisphenol type brominated epoxy resin (the same as in Example 1) | 100 |
| Brominated polyvinylphenol (the same as in Example 1) | 15 |
| 2-Undecylimidazole | 1 |

This example contains a gum material in an amount less than the scope according to the present invention.

COMPARATIVE EXAMPLE 4

The procedures of Example 1 were followed to prepare an adhesive composition in the form of a solution which was in turn coated on a film, laminated with a copper foil after drying and then cured. The adhesive composition was composed of the following components:

| Components | Parts by weight |
|---|---|
| Gum 5 | 60 |
| Bisphenol type brominated epoxy resin (the same as in Example 1) | 100 |
| Brominated polyvinylphenol (the same as in Example 1) | 3 |
| 2-Undecylimidazole | 1 |

This example contains the brominated polyvinylphenol in an amount lesser than the scope according to the present invention.

COMPARATIVE EXAMPLE 5

The procedures of Example 1 were followed to give an adhesive composition in the form of a solution which was in turn coated on a film, laminated with a copper foil after drying and then cured. The adhesive composition was comprised of the following components:

| Components | Parts by weight |
|---|---|
| Gum 5 | 60 |
| Bisphenol type brominated epoxy resin (the same as in Example 1) | 100 |
| Brominated polyvinylphenol (the same as in Example 1) | 25 |

-continued

| Components | Parts by weight |
|---|---|
| 2-Undecylimidazole | 1 |

This example contains the brominated polyvinylphenol in an amount larger than the scope according to the present invention.

Tests

The adhesives prepared according to the above Examples and Comparative Examples were determined for heat resistance against soldering (according to Standards of Institute of Printed Circuits IPC FC-240A), peel strength (according to IPC FC-240A), surface electric resistance (according to Japanese Industry Standards (JIS) designation JIS Z3179) and non-flamability (according to UL-94). The results are shown in the table below:

TABLE

| | Heat Resistance against Soldering | Peel Strength (Kg/cm) | Surface Electric Resistance (ohms) | Non-Flamability |
|---|---|---|---|---|
| Example 1 | Good | 0.9 | $3 \times 10^{12}$ | V - O |
| Example 2 | " | 1.1 | $2 \times 10^{12}$ | " |
| Example 3 | " | 0.6 | $1 \times 10^{13}$ | " |
| Example 4 | " | 0.8 | $2 \times 10^{12}$ | " |
| Example 5 | " | 1.0 | $1 \times 10^{12}$ | " |
| Example 6 | " | 0.6 | $5 \times 10^{13}$ | " |
| Comparative Example 1 | Poor (causing blisters) | 0.8 | $6 \times 10^{12}$ | " |
| Comparative Example 2 | Good | 1.3 | $5 \times 10^{11}$ | HB |
| Comparative Example 3 | " | 0.4 | $5 \times 10^{13}$ | V - O |
| Comparative Example 4 | Poor | 0.9 | $2 \times 10^{12}$ | " |
| Comparative Example 5 | Good | 0.5 | $5 \times 10^{12}$ | " |

It is apparent from the above Table that the adhesives according to the present invention satisfy all the requirements and characteristics.

On the other hand, the adhesive according to Comparative Example 1 is poor in heat resistance against soldering because of a small amount of acrylic acid and consequently a low degree of crosslinkage. The adhesive according to Comparative Example 2 is poor in non-flamability and low in electric resistance because of a larger amount of the acrylic copolymer. Comparative Example 3 indicates a low adhesivity because of a too small amount of the acrylic copolymer. Comparative Example 4 indicates a poor heat resistance against soldering due to a small amount of the brominated polyvinylphenol. Comparative Example 5 represents a poor adhesivity due to a too large amount of the brominated polyvinylphenol and consequently a too high cohesivity of the cured product.

EXAMPLE 7

Gum 5 and Gum 6 were blended in a Gum 5 to Gum 6 ratio of 4 to 3 to form a blend gum (so referred to herein) which was in turn treated in substantially the same manner as in Example 1 to give an adhesive composition in the form of a solution (35% concentration with industrial ethyl alcohol and methyl ethyl ketone as solvents). The solution was coated on a film, laminated with a copper foil after drying and cured to a full extent. The adhesive composition was composed of the following components:

| Components | Parts by weight |
|---|---|
| Blend gum | 40 |
| Bisphenol type brominated epoxy resin (the same as in Example 1) | 100 |
| Brominated polyvinylphenol (the same as in Example 1) | 10 |
| 2-Undecylimidazole | 0.8 |

EXAMPLE 8

The procedures of Example 7 were followed in the same manner to provide an adhesive composition in the form of a solution (35% concentration with a mixture of industrial ethylalcohol and methyl ethyl ketone) which was in turn coated on a film, laminated with a copper foil after drying, and cured to a full extent. The adhesive composition was composed of the following components:

| Components | Parts by weight |
|---|---|
| Blend gum (the same as in Example 7) | 60 |
| Bisphenol type brominated epoxy resin (the same as in Example 1) | 100 |
| Brominated polyvinylphenol (the same as in Example 1) | 10 |
| 2-Undecylimidazole | 0.5 |

EXAMPLE 9

The procedures of Example 7 were followed to provide an adhesive composition in the form of a solution (35% concentration with a mixture of industrial ethylalcohol and methyl ethyl ketone) which was in turn coated on a film, laminated with a copper foil after drying and cured fully. The adhesive composition was composed of the following components:

| Components | Parts by weight |
|---|---|
| Blend gum (the same as in Example 7) | 80 |
| Bisphenol type brominated epoxy resin (the same as in Example 1) | 100 |
| Brominated polyvinylphenol (the same as in Example 1) | 15 |
| 2-Methylimidazole | 0.6 |

EXAMPLE 10

In substantially the same manner as in Example 7, an adhesive composition in the form of a solution was prepared in a 35% concentration with a mixture of industrial ethylalcohol and methyl ethyl ketone. The solution was then coated on a film, laminated with a copper foil after drying and cured to a full extent. The adhesive composition was composed of the following components:

| Components | Parts by weight |
|---|---|
| Blend gum (the same as in Example 7) | 60 |

| Components | Parts by weight |
| --- | --- |
| Novolak type brominated epoxy resin (the same as in Example 3) | 100 |
| Brominated polyvinylphenol (the same as in Example 1) | 5 |
| 2-Ethyl-4-methylimidazole | 1 |

EXAMPLE 11

In substantially the same manner as in Example 7, an adhesive composition in the form of a solution was prepared in a 35% concentration with a mixture of industrial ethylalcohol and methyl ethyl ketone. The solution was then coated on a film, laminated with a copper foil after drying, and cured to a full extent. The adhesive composition used was composed of the following components:

| Components | Parts by weight |
| --- | --- |
| Blend gum (the same as in Example 7) | 60 |
| Bisphenol type brominated epoxy resin (the same as in Example 1) | 100 |
| Brominated polyvinylphenol (the same as in Example 1) | 15 |
| 2-Undecylimidazole | 2.0 |

COMPARATIVE EXAMPLE 6

An adhesive composition in the form of a solution was prepared in a 35% concentration with a mixture of industrial ethylalcohol and methyl ethyl ketone in the same manner as in Example 1. The solution was coated on a film, laminated with a copper foil after drying, and cured to a full extent. The adhesive composition was composed of the following components:

| Components | Parts by weight |
| --- | --- |
| Blend gum (the same as in Example 7) | 100 |
| Bisphenol type brominated epoxy resin (the same as in Example 1) | 100 |
| Brominated polyvinylphenol (the same as in Example 1) | 15 |
| 2-Methylimidazole | 0.7 |

This example contains the blend gum in an amount greater than the scope according to the present invention.

COMPARATIVE EXAMPLE 7

An adhesive composition in the form of a solution was prepared in a 35% concentration with a mixture of industrial ethyl alcohol and methyl ethyl ketone in the same manner as in Example 1. The solution was coated on a film, laminated with a copper foil after drying, and cured to a full extent. The adhesive composition was composed of the following components:

| Components | Parts by weight |
| --- | --- |
| Blend gum (the same as in Example 7) | 20 |
| Bisphenol type brominated epoxy resin (the same as in Example 1) | 100 |
| Brominated polyvinylphenol (the same as in Example 1) | 15 |
| 2-Methylimidazole | 0.7 |

This example contains the blend gum in an amount lesser than the scope according to the present invention.

COMPARATIVE EXAMPLE 8

An adhesive composition was prepared in the form of a solution in a 35% concentration with a mixture of industrial ethyl alcohol and methyl ethyl ketone. The solution was coated on a film, laminated with a copper foil after drying, and cured to a full extent. The adhesive composition was composed of the following components:

| Components | Parts by weight |
| --- | --- |
| Blend gum (the same as in Example 7) | 60 |
| Bisphenol type brominated epoxy resin (the same as in Example 1) | 100 |
| Brominated polyvinylphenol (the same as in Example 1) | 2.5 |
| 2-Undecylimidazole | 0.7 |

This example contains the brominated polyvinylphenol in an amount lesser than the scope according to the present invention.

COMPARATIVE EXAMPLE 9

An adhesive composition in the form of a solution was prepared in a 35% concentration with a mixture of industrial ethyl alcohol and methyl ethyl ketone in the same manner as in Example 7. The solution was coated on a film, laminated with a copper foil after drying, and cured to a full extent. The adhesive composition was composed of the following components:

| Components | Parts by weight |
| --- | --- |
| Blend gum (the same as in Example 7) | 100 |
| Bisphenol type brominated epoxy resin (the same as in Example 1) | 100 |
| Brominated polyvinylphenol (the same as in Example 1) | 25 |
| 2-Ethyl-4-methylimidazole | 0.7 |

This example contains the blend gum and the brominated polyvinylphenol in amounts larger than the scopes according to the present invention.

The adhesives prepared according to Examples 7 to 11 and Comparative Examples 6 to 9 were determined for their heat resistance against soldering, adhesivity, surface electric resistance, and non-flamability according to the same procedures as above. The results are shown in the table below:

TABLE 2

| | Heart Resistance against Soldering | Peel Strength (Kg/cm) | Surface Electric Resistance (ohms) | Non-Flamability |
|---|---|---|---|---|
| Example 7 | Good | 0.6 | $5 \times 10^{13}$ | V-O |
| Example 8 | " | 0.8 | $3 \times 10^{12}$ | " |
| Example 9 | " | 1.2 | $1 \times 10^{12}$ | " |
| Example 10 | " | 0.6 | $3 \times 10^{12}$ | " |
| Example 11 | " | 0.9 | $5 \times 10^{12}$ | " |
| Comparative Example 6 | " | 1.3 | $5 \times 10^{11}$ | HB |
| Comparative Example 7 | " | 0.4 | $5 \times 10^{13}$ | V-O |
| Comparative Example 8 | Poor | 0.7 | $2 \times 10^{12}$ | " |
| Comparative Example 9 | Good | 1.3 | $5 \times 10^{11}$ | HB |

It is apparent from the above results that the adhesives according to the present invention satisfy all the requirements and characteristics. For example, they are not damaged in the soldering at 300° C. for 60 seconds and, in fact, they can endure at 320° C. for 2 minutes. Aging in an oven at 130° C. for 10 days did not cause any change in color with considerable adhesivity retained. On the other hand, Comparative Example 6 was poor in non-flamability and electric resistance because of a large amount of the acrylic copolymer gum (a too small amount of the epoxy resin). Comparative Example 7 was poor in adhesivity because of a too small amount of the acrylic copolymer. Comparative Example 8 causes a poor heat resistance against soldering because of a too small amount of the brominated polyvinylphenol. Comparative Example 9 was poor in surface electric resistance and non-flamability because the acrylic copolymer and the brominated polyvinylphenol were too small in amounts.

What is claimed is:

1. A non-flamable adhesive composition comprising 100 parts by weight of a brominated epoxy resin, 40-80 parts by weight of an acrylic copolymer and 5-20 parts by weight of a brominated polyvinylphenol, said acrylic copolymer being prepared by copolymerizing (a) 5-35% by weight of acrylonitrile, (b) 0.5-10% by weight of an ethylenically unsaturated compound having at least one functional group selected from carboxyl group, hydroxyl group and epoxy group, and (c) substantially the balance of an ester obtainable from an alcohol having from 1 to 6 carbon atoms and acrylic acid and/or methacrylic acid.

2. The non-flamable adhesive composition according to claim 1, wherein the epoxy resin is a bisphenol type brominated epoxy resin represented by the following formula:

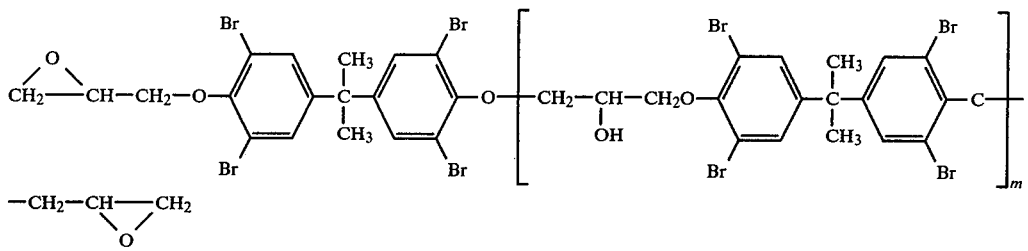

(wherein m is 0, 1 or 2).

3. The non-flamable adhesive composition according to claim 1, wherein the epoxy resin is a novolak type brominated epoxy resin represented by the following formula:

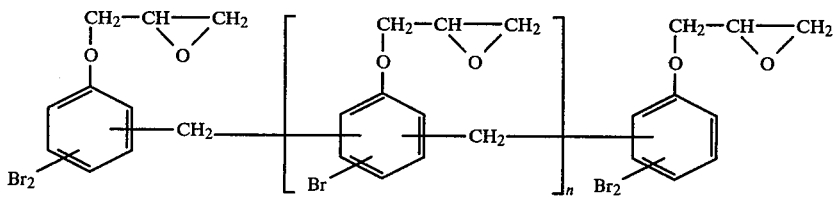

(wherein n is an integer less than 10).

4. The non-flamable adhesive composition according to claim 3, wherein the novolak type brominated epoxy resin is represented by the said formula wherein n is an integer from 0 to 4.

5. The non-flamable adhesive composition according to claim 1, wherein the brominated polyvinylphenol has a recurring unit represented by the following formula:

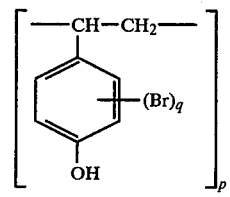

(wherein p is an integer from 20 to 70 and q is an integer from 1 or 2).

6. The non-flamable adhesive composition according to claim 1 further containing 0.6 to 2.0 parts by weight of an amine compound and an imidazole compound.

7. The non-flamable adhesive composition according to claim 1 further containing less than 20 parts by weight of a non-flamable inorganic compound.

8. The non-flamable adhesive composition according to claim 5, wherein the amine compound is a primary, secondary or tertiary aliphatic amine, an unsaturated aliphatic amine, an alicyclic amine or an aromatic amine.

9. The non-flamable adhesive composition according to claim 5, wherein the imidazole compound is an aliphatic-substituted imidazole or an aromatic-substituted imidazole.

10. The non-flamable adhesive composition according to claim 6, wherein the non-flamable inorganic compound is antimony trioxide, aluminum hydroxide or barium borate.

11. The non-flamable adhesive composition according to claim 1, further comprising at least one of an epoxy resin without containing bromine, phenolic resin or melamine resin up to 10 parts by weight based on 100 parts by weight of said brominated epoxy resin.

* * * * *